United States Patent
Kaneko et al.

(10) Patent No.: US 12,131,881 B2
(45) Date of Patent: Oct. 29, 2024

(54) ELECTRON MICROSCOPE AND SPECIMEN CONTAMINATION PREVENTION METHOD

(71) Applicant: JEOL Ltd., Tokyo (JP)

(72) Inventors: Takeshi Kaneko, Tokyo (JP); Norihiro Okoshi, Tokyo (JP); Yu Jimbo, Tokyo (JP); Sang Tae Park, Pleasanton, CA (US)

(73) Assignee: JEOL Ltd., Tokyo (JP)

( * ) Notice: Subject to any disclaimer, the term of this patent is extended or adjusted under 35 U.S.C. 154(b) by 338 days.

(21) Appl. No.: 17/718,976

(22) Filed: Apr. 12, 2022

(65) Prior Publication Data

US 2022/0328280 A1 Oct. 13, 2022

(30) Foreign Application Priority Data

Apr. 13, 2021 (JP) ................... 2021-067610

(51) Int. Cl.
*H01J 37/22* (2006.01)
*H01J 37/244* (2006.01)
*H01J 37/28* (2006.01)

(52) U.S. Cl.
CPC ............ *H01J 37/22* (2013.01); *H01J 37/244* (2013.01); *H01J 37/28* (2013.01); *H01J 2237/022* (2013.01); *H01J 2237/2802* (2013.01)

(58) Field of Classification Search
CPC .. H01J 37/00; H01J 37/02; H01J 37/22; H01J 37/244; H01J 37/26; H01J 37/28; H01J 37/228; H01J 2237/022; H01J 2237/2802; H01J 2237/244
USPC ......................................... 250/306, 307, 311
See application file for complete search history.

(56) References Cited

U.S. PATENT DOCUMENTS

| | | | | |
|---|---|---|---|---|
| 4,980,536 A | * | 12/1990 | Asch ............... | H01L 21/268 |
| | | | | 219/121.68 |
| 2005/0263715 A1 | * | 12/2005 | Nakasuji ........... | H01J 37/141 |
| | | | | 250/311 |
| 2010/0044566 A1 | * | 2/2010 | Donitz ............. | B08B 7/0035 |
| | | | | 250/311 |
| 2011/0248164 A1 | | 10/2011 | Straw et al. | |

(Continued)

FOREIGN PATENT DOCUMENTS

| JP | H03098244 A | 4/1991 |
|---|---|---|
| JP | 2001236914 A | 8/2001 |
| JP | 200455261 A | 2/2004 |

(Continued)

OTHER PUBLICATIONS

Evans et al.; Single Shot Nanosecond Imagine in the Dynamic TEM, JEOL News, vol. 44, No. 1, 2009, pp. 12-16.

(Continued)

*Primary Examiner* — Jason L McCormack
(74) *Attorney, Agent, or Firm* — The Webb Law Firm

(57) ABSTRACT

A contamination prevention irradiation device includes a generation unit and a mirror unit. The generation unit generates a laser beam. The mirror unit has a mirror surface for reflecting a laser beam. The laser beam reflected on the mirror surface is applied to a specimen disposed inside an objective lens. The laser beam is composed of a pulse train. Once a laser beam is applied to the specimen before observation of the specimen, deposition of contaminants on the specimen can be prevented for a predetermined subsequent period.

15 Claims, 9 Drawing Sheets

(56) References Cited

U.S. PATENT DOCUMENTS

2016/0005566 A1    1/2016   Zewail et al.

FOREIGN PATENT DOCUMENTS

| JP | 2013524466 A | 6/2013 |
| JP | 2016189326 A | 11/2016 |
| WO | 2013169872 A1 | 11/2013 |

OTHER PUBLICATIONS

1 Extended European Search Report issued in EP22166780.1 on Sep. 22, 2022.
Office Action issued in JP2021067610 on Mar. 28, 2023.

* cited by examiner

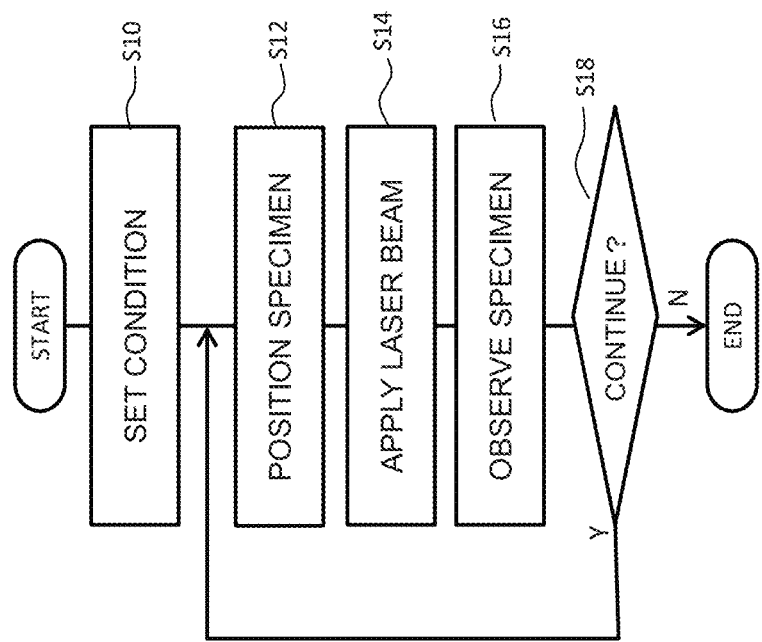
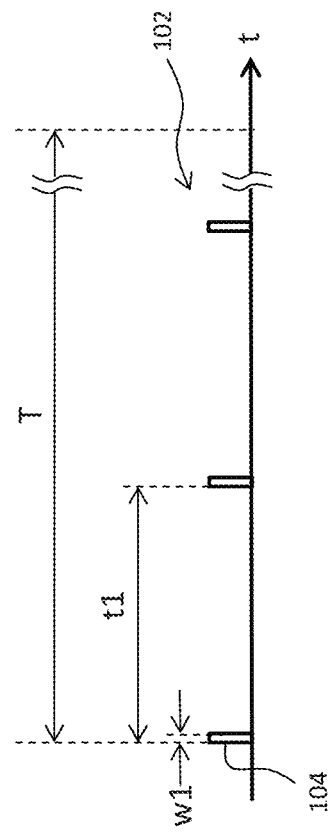

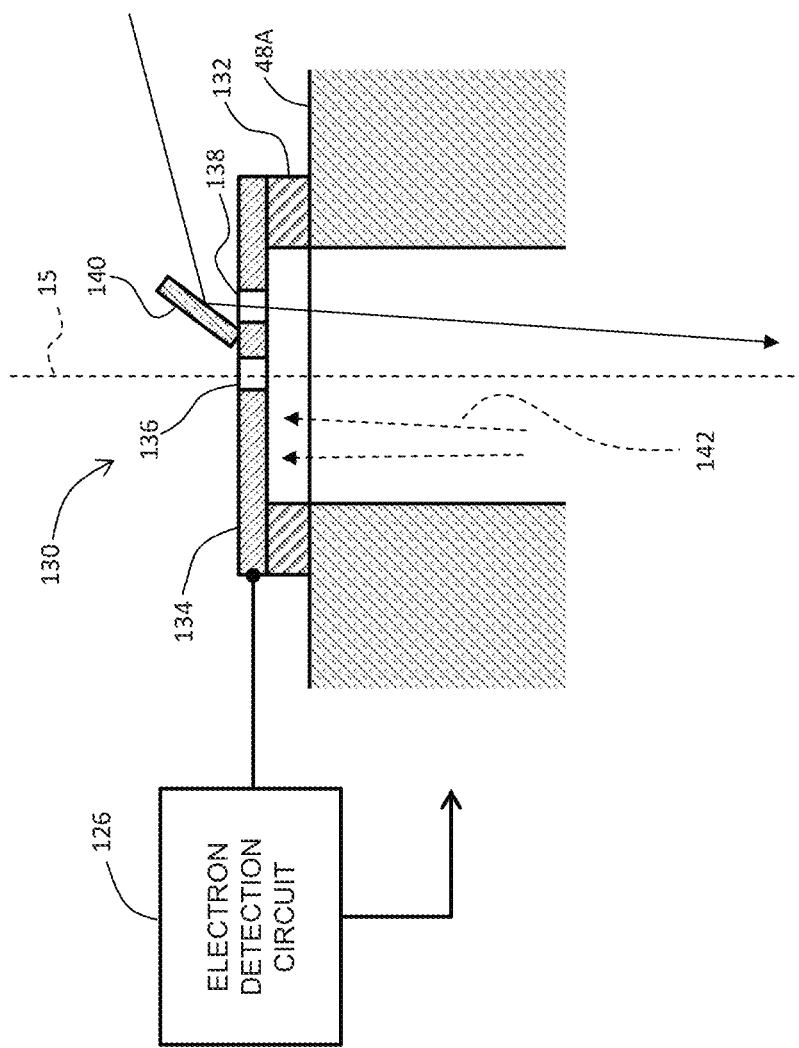

ELECTRON MICROSCOPE AND SPECIMEN CONTAMINATION PREVENTION METHOD

CROSS-REFERENCE TO RELATED APPLICATION

This application claims priority to Japanese Patent Application No. 2021-067610 filed Apr. 13, 2021, the disclosure of which is hereby incorporated by reference in its entirety.

BACKGROUND

Field of the Disclosure

The present disclosure relates to an electron microscope and a specimen contamination prevention method, in particular, to a technique for applying processing for contamination prevention to specimens.

Description of Related Art

In an electron microscope, irradiation of a specimen with an electron beam leads to gradual deposition of contaminants on the specimen, which phenomenon is referred to as beam-induced specimen contamination. Specifically, it is considered that, for example, carbon molecules contained in the residual gas having been present in a vacuum chamber or those in the gas discharged from a specimen undergo chemical reaction to be deposited on the surface of a specimen. In general, the deposited contaminants are carbon compounds (specifically, hydrocarbons).

For example, JP 2004-55261A discloses beam shower as a technique for preventing contamination of specimens. Beam shower is irradiation of a partial area on a specimen that is a target for observation at a high magnification, with a spreading electron beam (an electron beam for observation at a low magnification) prior to observation. The precise mechanism for contamination prevention with beam shower has yet to be strictly clarified to a full extent. For example, an explanation states that beam shower causes attachment or deposition of contaminants in a wider area on the surface of a specimen to thereby prevent local deposition of contaminants. Another explanation states that beam shower removes contaminants remaining or deposited on a specimen. In any case, a contamination prevention effect with beam shower does not last very long. For example, beam shower for five minutes under a given condition produces a contamination prevention effect lasting for about five minutes, for example. In addition, it is noted that repetitive application of beam shower raises a problem of a prolonged time for a full procedure for observing a specimen.

Other techniques for preventing contamination of specimens include specimen cleaning with a cold trap and plasma or ozone. These techniques, however, are not designed for limited contamination prevention in a local area on a specimen.

Further, JP2016-189326A discloses an electron microscope in which a specimen is irradiated with a laser beam for thermal deformation. Further, JP2013-524466A discloses an electron microscope in which a specimen is irradiated with a laser beam for cauterization. However, the respective techniques disclosed in JP2016-189326A and JP2013-524466A do not aim for contamination prevention for specimens.

SUMMARY

The present disclosure aims for effective contamination prevention for specimens. Alternatively, the present disclosure aims for applying processing for contamination prevention for specimens to a local area. Alternatively, the present disclosure aims for reducing a processing time for contamination prevention for specimens.

According to one aspect of this disclosure, there is provided an electron microscope including an electron beam emission unit for applying an electron beam to a specimen along the optical axis, and a contamination prevention irradiation device for applying a laser beam for contamination prevention to the specimen along the optical axis.

According to another aspect of this disclosure, there is provided a specimen contamination prevention method including a step of generating a laser beam for contamination prevention; and a step of applying the laser beam for contamination prevention to a contamination prevention irradiation area that is a local area encompassing at least a part of a specimen, wherein the laser beam for contamination prevention is applied to the specimen before an electron beam is applied to the specimen for observation of the specimen.

BRIEF DESCRIPTION OF THE DRAWINGS

Embodiment(s) of the present disclosure will be described based on the following figures, wherein:

FIG. 6 illustrates a pulse train;

FIG. 7 is a flowchart of an exemplary operation;

FIG. 12 illustrates a modified example of the second embodiment.

DETAILED DESCRIPTION

Figure 1:
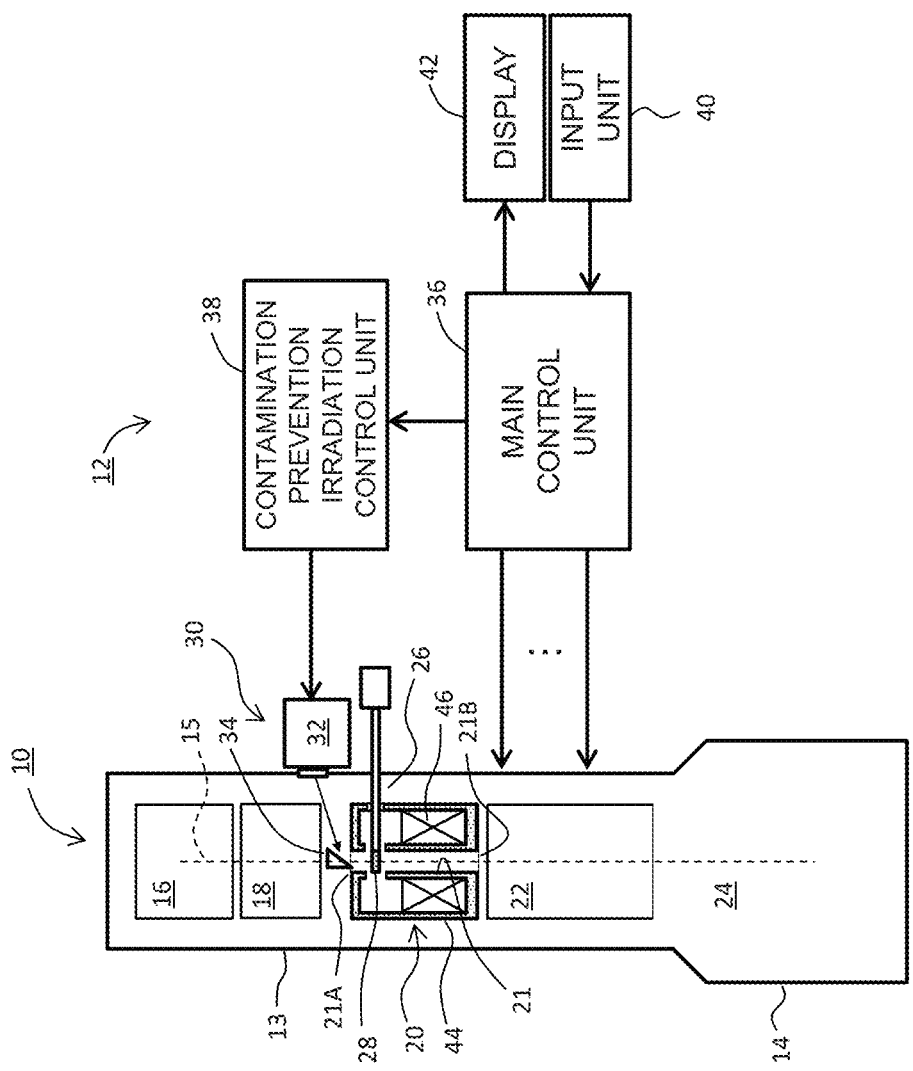
FIG. 1 illustrates a scanning transmission electron microscope according to a first embodiment.

Embodiments will now be described by reference to the following drawings.

(1) Outline of Embodiments

An electron microscope according to an embodiment has an electron beam emission unit and a contamination prevention irradiation device. The electron beam emission unit emits (applies) an electron beam to a specimen along the optical axis. The contamination prevention irradiation device emits (applies) a laser beam for contamination prevention to a specimen along the optical axis.

Experiments conducted by the inventors of the present invention have proved that irradiation of a specimen with a laser beam before observation of the specimen enables effective prevention of deposition of contaminants on the specimen for a relatively long period of time. They have also proved that irradiation of a specimen having contaminants already deposited thereon with a laser beam enables removal of the deposited contaminants. Although the detailed mechanism for contamination prevention through irradiation with a laser beam is yet to be clarified at the present time, there is noted a possibility, as it is inferred that the temperature of the portion of a specimen irradiated with a laser beam becomes high, that irradiation with a laser beam accelerates removal and discharge of contaminants on or in the specimen.

In this embodiment, a laser beam (a laser beam for contamination prevention for specimens) satisfying a given condition is applied to a specimen. That is, the specimen is subjected to a laser beam regulated so as to prevent deposition of contaminants on a specimen without causing such damage to the specimen that would impede observation of the specimen.

Specifically, a laser beam is applied to a specimen along the optical axis. That is, a laser beam is applied to a specimen in the direction of the optical axis or in a direction close to the direction of the optical axis. Application of a laser beam through an electron beam path in an objective lens can be considered as one aspect of application of a laser beam along the optical axis.

Application of a laser beam along the optical axis enables restriction of an area for irradiation with the laser beam on a specimen to a local area. This facilitates adjustment of the position and dimension of an area to be irradiated with a laser beam. Further, application of a laser beam to a local area enables observation of an area not irradiated with a laser beam. Further, should the specimen be partially damaged through initial irradiation with a laser beam, it is possible to apply a laser beam to the remaining portion of the specimen under a changed irradiation condition for a laser beam, and then to observe the remaining portion.

When an electron beam is applied to a surface of a specimen on one side, a laser beam as well may be applied to a surface on the same side. Alternatively, a laser beam may be applied to the surface on the other side. The contamination prevention irradiation device may be mounted on a transmission electron microscope (TME), or on a scanning electron microscope (SEM). Although application of a laser beam to a specimen is generally conducted before observation of the specimen (that is, before application of an electron beam), an electron beam and a laser beam can be applied to a specimen in parallel at the same time or alternately in a time sharing manner. Note that the contamination prevention irradiation device may be used also to apply a laser beam for optical reaction (for example, a relatively strong laser beam) to a specimen during observation thereof.

In the embodiment, the specimen is a thin-film specimen having a front surface and a rear surface. A detection spot is defined on the side of the rear surface of a specimen, where an electron beam having penetrated the specimen is to be detected. Irradiation of a specimen with a laser beam prevents deposition of contaminants on the front and rear surfaces of the specimen. That is, in the case where a contamination prevention irradiation device is mounted on a transmission electron microscope, and applies a laser beam to a specimen, both the front and rear surfaces of the specimen can be processed at the same time. Note that the concept of thin-film specimens includes thin-piece specimens. Specimens (observation targets) having shapes different from those mentioned above may be irradiated with a laser beam. The thickness of a thin-film specimen is, for example, a few hundred nm or less.

In this embodiment, the contamination prevention irradiation device applies a laser beam to an area to be irradiated with a laser beam for preventing contamination (hereinafter referred to as a contamination prevention irradiation area) that encompasses at least a part of a specimen. Specifically, a contamination prevention irradiation area is a local area that encompasses an observation area to be irradiated with an electron beam. Note that the concept of an observation area can include an observation point (an analysis point). In this embodiment, the contamination prevention irradiation device applies a laser beam to a contamination prevention irradiation area before an electron beam is applied to the observation area.

In this embodiment, a laser beam is composed of a pulse train that is regulated so as to prevent deposition of contaminants on a specimen. Specifically, a contamination prevention irradiation device intermittently applies to a specimen a plurality of pulses constituting a pulse train. Intermittent application of a plurality of pulses can reduce the amount of irradiation energy per unit period of time while appropriately heating the specimen. This can protect the specimen.

In this embodiment, the contamination prevention irradiation device includes a generation unit and a mirror unit. The generation unit generates a laser beam. The mirror unit has a mirror surface for reflecting a laser beam, and is disposed between the generation unit and a specimen.

An electron microscope according to this embodiment has a lens barrel for accommodating the electron beam emission unit. The generation unit is disposed outside the lens barrel, while the mirror unit is disposed inside the lens barrel. The generation unit is disposed outside the lens barrel due to the limited space inside the lens barrel, as well as for the purpose of preventing the generation unit from becoming a contaminant discharger. Note that the concept of an electron beam emission unit can include electron guns, condenser lenses, and so forth.

The electron microscope according to this embodiment has an electron beam inlet, an electron beam outlet, and an objective lens that has a specimen space for accommodating a specimen. A laser beam reflected on the mirror unit is applied to the specimen in the objective lens through the electron beam inlet or the electron beam outlet.

In this embodiment, the mirror unit is mounted on the objective lens. This structure can reduce an error in positioning the mirror unit, and facilitate adjustment of the mirror unit.

In this embodiment, the electron beam inlet is defined on an end of the objective lens on one side. The specimen space is ensured inside the objective lens at a position displaced toward the one side. The mirror unit is disposed in or near the electron beam inlet of the objective lens. This structure leaves only a short distance between the mirror unit and the specimen. This can facilitate adjustment of the mirror unit, and also makes it possible to define an appropriate contamination prevention irradiation area on the specimen. Note that the one side and the other side refer to, for example, the upper side and the lower side, respectively.

In this embodiment, a part or the entirety of the mirror unit functions as a sensor for receiving electrons discharged from the specimen. Examples of the electrons to be detected include secondary electrons and reflection electrons.

A specimen contamination prevention method according to this embodiment includes a first step and a second step. In the first step, a laser beam for contamination prevention is generated. In the second step, the generated laser beam for contamination prevention is applied to a contamination prevention irradiation area, which is a local area encompassing at least a part of the specimen. Before application of an electron beam to the specimen to observe the specimen, a laser beam for contamination prevention is applied to the specimen.

This procedure, including application of a laser beam for contamination prevention to a specimen and subsequent observation of the specimen, can effectively prevent deposition of contaminants during a process for observation of the specimen. Although a laser beam may be emitted diagonally to the specimen, such a diagonal emission may suffer from restriction or blockage of the laser beam being emitted to the specimen with other members (such as a specimen holder), depending on the position and posture of the specimen. Further, such a diagonal emission may make it difficult to readily define an irradiation area having an appropriate dimension in an appropriate position on the specimen. In contrast, such a problem can be avoided by emission of a laser beam to a specimen along the optical axis; that is, emission of a laser beam in a direction substantially the same as the direction of emission of an electron beam (or a direction in which an electron beam passes through).

(2) Details of Embodiments

FIG. 1 illustrates an electron microscope according to a first embodiment. The illustrated electron microscope is a scanning transmission electron microscope (STEM). A scanning transmission electron microscope is adapted to a converging irradiation mode and a parallel irradiation mode. In the converging irradiation mode, an electron beam (an electron probe) that converges on a specimen is scanned, and electrons having penetrated the specimen are detected. Meanwhile, in the parallel irradiation mode, a spreading electron beam is applied toward a specimen, and electrons having penetrated the specimen are detected.

The scanning transmission electron microscope includes a measurement unit 10 and an information processing unit 12. The measurement unit 10 has a lens barrel 13 and a lens barrel base 14. A vacuum device, not illustrated, for making vacuum the inside of the lens barrel 13 and the lens barrel base 14 is provided.

Inside the lens barrel 13, a plurality of structural units are aligned along an optical axis 15, as schematically illustrated in FIG. 1. Specifically, the lens barrel 13 incorporates an electron gun 16, a condenser lens 18, an objective lens 20, an imaging lens 22 (a projection lens), or the like. The optical axis 15 is a central axis of emission of an electron beam. In this embodiment, the electron gun 16, the condenser lens 18, and the objective lens 20 together constitute an electron beam emission unit.

The electron gun 16 generates an electron beam. The generated electron beam penetrates the condenser lens 18 to enter the objective lens 20. The condenser lens 18 is composed of a plurality of lens components, and optically acts on the electron beam in accordance with the mode selected.

A specimen 28 is disposed in the objective lens 20. The specimen 28 has a thin-film shape (in the form of a thin piece), for example. Alternatively, the specimen 28 may be powder. The specimen 28 is held with a specimen holder 26. The position and the posture of the specimen 28 are adjusted with an unillustrated mechanism.

The objective lens 20 has a yoke 44 and a coil 46. The yoke 44 has a pole piece assembled therein. In the illustrated exemplary structure, a specimen space is defined in the upper portion of the objective lens 20, and the specimen 28 is disposed inside the specimen space. In the objective lens 20, the pole piece is disposed at a position displaced toward one side (the upper side) of the objective lens 20, while the coil 46 is disposed at a position displaced toward the other side (the lower side). Alternatively, the specimen space may be defined in the middle in the longitudinal direction in the objective lens 20. The objective lens 20 has a path 21 formed therein extending along the optical axis 15, whose upper end constitutes an electron beam inlet 21A and whose lower end constitutes an electron beam outlet 21B.

The imaging lens 22 is composed of a plurality of lens components. The inside of the lens barrel base 14 forms an observation room 24, where a plurality of unillustrated detection devices are disposed. Between the condenser lens 18 and the objective lens 20, an aberration corrector or the like may be disposed.

The scanning transmission electron microscope according to this embodiment includes a contamination prevention irradiation device 30. The contamination prevention irradiation device 30 has a generation unit 32 and a mirror unit 34. Processing for contamination prevention is applied to the specimen 28 prior to observation of the specimen 28 with an electron beam applied thereto. Specifically, a laser beam for contamination prevention is applied to the specimen 28 prior to the observation. That is, the generation unit 32 generates a laser beam, which is reflected on the mirror surface of the mirror unit 34 and then applied to the specimen 28.

The generation unit 32 is disposed outside the lens barrel 13, while the mirror unit 34 is disposed inside the lens barrel 13. Disposition of the generation unit 32 outside the lens barrel 13 can prevent the generation unit 32 from becoming a contaminant discharger. The mirror unit 34 has a minute through hole penetrating therethrough along the optical axis, so that an electron beam passes through the through hole.

The information processing unit 12 includes a main control unit 36 and a contamination prevention irradiation control unit 38. The main control unit 36 controls the operation of the respective structural components constituting the scanning transmission electron microscope. Under control by the main control unit 36, the contamination prevention irradiation control unit 38 controls the operation of the generation unit 32 of the contamination prevention irradiation device 30. Specifically, the operation of the generation unit 32 is controlled so as to generate a predetermined pulse train as a laser beam.

The information processing unit 12 has a processor for executing a program, which is composed of a central processing unit, or CPU, for example. That is, the main control unit 36 and the contamination prevention irradiation control unit 38 are substantially programs. The main control unit 36 is connected to an input unit 40 and a display 42. The input unit 40 includes a keyboard, for example. The display 42 includes a liquid crystal display (LCD) for example. A user sets an electron beam irradiation condition, using the input unit 40, and also sets a laser beam irradiation condition. A user selects an operation mode, using the input unit 40, and also selects whether to execute contamination prevention processing. The display 42 shows a TEM image or a STEM image as an electron microscope image. Further, the display 42 shows the result of analysis in the form of a spectrum, for example, when necessary.

Figure 2:
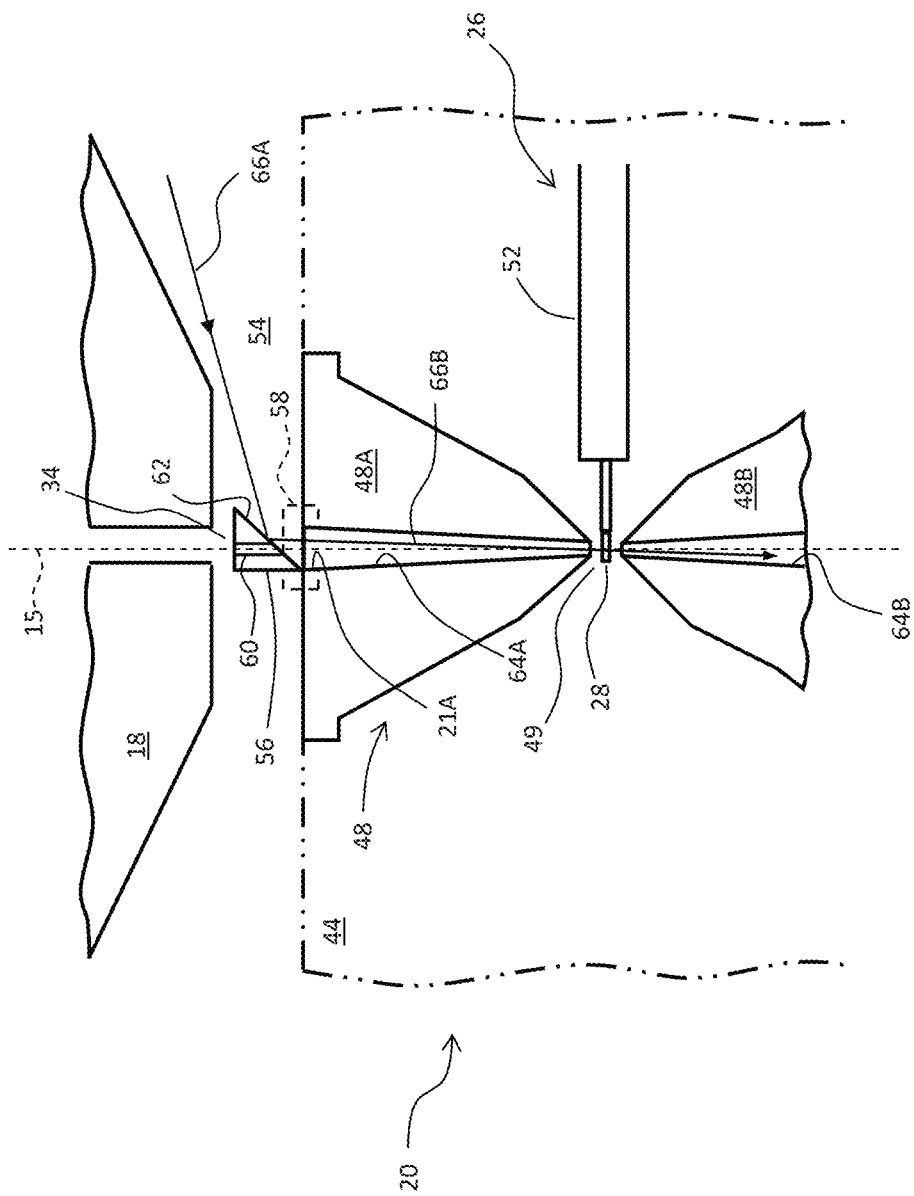
FIG. 2 is an enlarged view of an upper portion of an objective lens.

FIG. 2 is an enlarged cross sectional view of the upper portion of the objective lens 20. As illustrated, the objective lens 20 has a pole piece 48 assembled in the yoke 44. The pole piece 48 is composed of an upper pole piece 48A and a lower pole piece 48B opposed to each other with a gap therebetween. The gap corresponds to a specimen holding space 49. A path 64A is formed in the upper pole piece 48A so as to extend along the optical axis 15, while a path 64B is formed in the lower pole piece 48B so as to extend along the optical axis 15. That is, an electron beam emitted to the specimen passes through the path 64A, and the electron beam having passed through the specimen passes through the path 64B.

The specimen holder 26 has a rod 52 for holding the specimen 28 on its leading end. The position and posture of the specimen can be changed with the rod 52.

Between the objective lens 20 and a member disposed on the objective lens 20 (specifically, the condenser lens 18), a space 54 is left, where the mirror unit 34 is disposed. In the case of an objective lens 20 having an aberration corrector thereon, the mirror unit 34 is disposed between the objective lens 20 and the aberration corrector.

The mirror unit 34 is a structure or an assemblage composed of a mirror block 56 and a mirror base 58. The mirror block 56 and the mirror base 58 are made of metal, such as aluminum, for example. The mirror block 56 is secured to the mirror base 58, which is removably connected to the upper pole piece 48A of the pole piece 48. As described above, the mirror unit 34 is disposed in or near the electron beam inlet of the objective lens 20.

The mirror block 56 has a through hole 60 extending along the optical axis 15, and an electron beam passes through the through hole 60. The mirror block 56 has a mirror surface 62, which is an inclined surface. A laser beam 66A from the generation unit is reflected on the mirror surface 62. The reflected laser beam 66B passes through the path 64A and is applied to the specimen 28.

Figure 3:
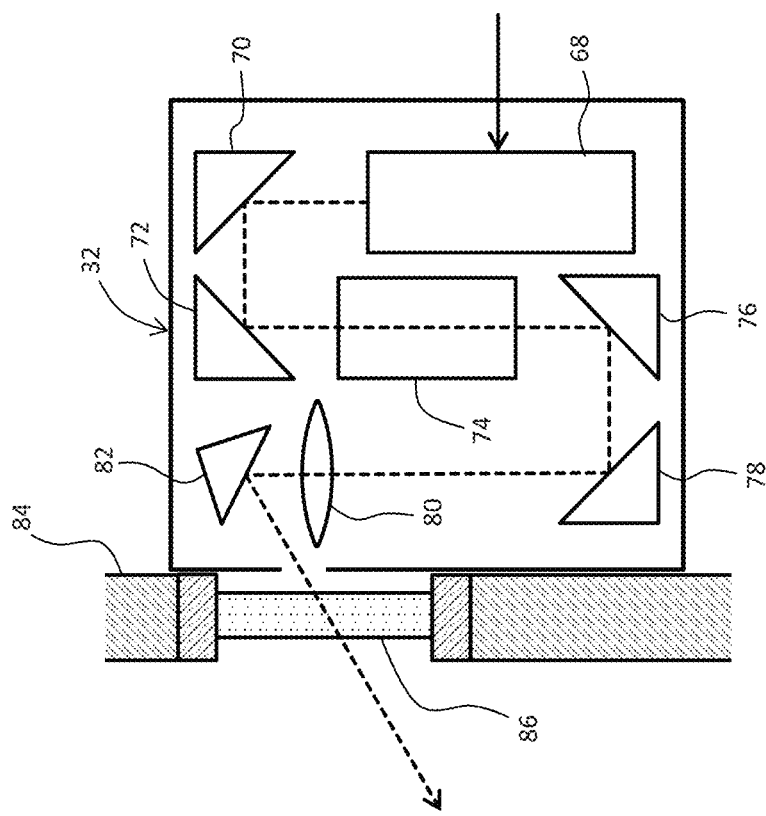
FIG. 3 illustrates an exemplary structure of a generation unit.

FIG. 3 illustrates an exemplary structure of the generation unit 32. Specifically, the box-like generation unit 32 is mounted on a housing 84 of the lens barrel. The housing 84 is made of stainless steel, for example. The inside of the housing 84 is a vacuum space, and the outside of the housing 84 is the air space. The housing 84 has an optically transparent window 86.

The generation unit 32 includes a laser beam source 68, mirrors 70, 72, a beam expander 74, mirrors 76, 78, an optical lens 80, a movable mirror 82, or the like. The laser beam source 68 generates a laser beam. Specifically, the laser beam source 68 generates a pulse train as a laser beam. The beam expander 74 enlarges the cross sectional dimension of the laser beam. The optical lens 80 optically acts on the laser beam such that the laser beam focuses on a predetermined position in the objective lens or on the front surface of the specimen. The movable mirror 82 finely adjusts the emission direction of the laser beam.

The generation unit 32 may incorporate a mechanism for scanning a laser beam or a mechanism for changing the dimension of an area to be irradiated with a laser beam (hereinafter referred to as a laser beam irradiation area) on a specimen. The operation of the laser beam source 68 is controlled by the contamination prevention irradiation control unit 38, illustrated in FIG. 1.

Figure 4:
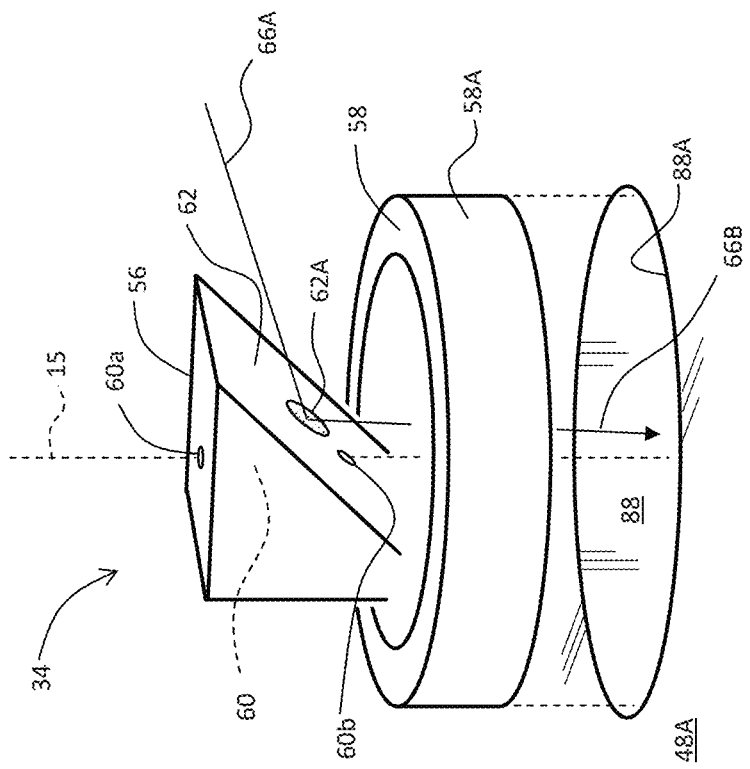
FIG. 4 illustrates a specific example of a mirror unit.

FIG. 4 illustrates a specific example of the mirror unit 34. A round opening 88 is formed on the upper pole piece 48A of the pole piece. The opening 88 corresponds to the electron beam inlet. The opening 88 has a screw portion 88A formed on its inner surface. The mirror base 58 is annular or columned, and has a screw portion 58A formed on its outer surface. The screw portion 58A is engaged with the screw portion 88A, whereby the mirror unit 34 is removably secured to the pole piece.

The lower end portion of the mirror block 56 is secured to the mirror base 58. The portion of the mirror base 58 other than the lower end portion is exposed on the upper side of the mirror base 58. The mirror block 56 has the through hole 60, whose upper end constitutes an opening 60a, and lower end constitutes an opening 60b. The through hole 60 is formed extending along the optical axis 15, so that an electron beam passes through the through hole 60. The opening 60a is formed on the upper surface of the mirror block 56, while the opening 60b is formed on the mirror surface 62.

A portion 62A for reflecting the laser beam 66A from the generation unit is defined on the mirror surface 62 at a position other than the opening 60b. Specifically, in the illustrated example, the portion 62A is defined at a position displaced slightly diagonally upward from the opening 60b. With this, the remaining portion, or a portion other than the portion 62A, is not necessarily an inclined surface. The mirror surface 62 is a surface subjected to mirror processing. As the mirror unit 34 is disposed in or near the electron beam inlet of the objective lens, the emission direction of the laser beam 66B can be readily adjusted so as to be directed to the specimen in the objective lens.

In this embodiment, a position to be irradiated with the laser beam 66B is adjusted such that the center of the laser beam irradiation area falls on the point on the specimen (or a position where the specimen is disposed) at which the optical axis penetrates. Further, the focal position or the like of the laser beam is adjusted such that the laser beam irradiation area on the specimen has a predetermined dimension (diameter).

In the objective lens, the pole piece is disposed at a position displaced upward, and a specimen is disposed at a position similarly displaced upward, as described above. In the case where the mirror unit 34 is disposed in the upper portion of the objective lens, the distance between the mirror unit 34 and the specimen is short. This can make a short path for irradiation with a laser beam.

Figure 5:
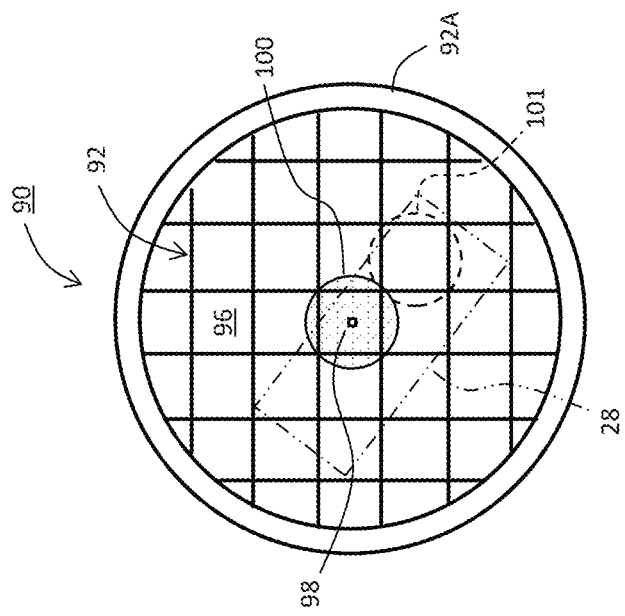
FIG. 5 illustrates an irradiation area.

FIG. 5 illustrates a grid 90. The grid 90 is held by a specimen holder, and functions as a specimen carrier. The grid 90 has a grating mesh portion 92, whose periphery is rimmed with an outer frame 92A. The specimen 28 is held by the mesh portion 92. The mesh portion 92 has a plurality of openings. A support film may be provided relative to the grid 90.

By adjusting the horizontal position of the grid 90 in the objective lens, the position of an observation area 98 is changed, and the position of a laser beam irradiation area 100 is also changed. In the illustrated example, the observation area 98 is defined on a thin film portion of the specimen 28, and encompassed in the irradiation area 100. The irradiation area 100 is a local area, with the presence of an area other than the irradiation area 100 (a non-irradiation area) on the specimen 28.

In the illustrated example, the irradiation area 100 is a round area having such a dimension (diameter) that encompasses one opening 96. The dimension may be set, for example, within a range from 1 to 100 µm, and is set to 30 µm, for example. The dimension of the irradiation area 100 can be arbitrarily determined depending on the purpose of measurement, the strength of a laser beam, the properties of the specimen, or the like. When the specimen is observed through a different opening, a laser beam is applied to that opening prior to observation (refer to reference number 101). In this case, in actually, the grid 90 is moved to change its position.

FIG. 6 illustrates a pulse train 102 constituting a laser beam. A laser beam source employed in this embodiment allows selection of an output strength from the range from 0.0001 to 500 µW/µm². In the case where the minimum output strength in this range is selected and a laser beam having that strength is applied to the specimen in the form of a continuous wave, there is a possibility that the specimen will be damaged or irradiated with a laser beam having a strength greater than necessary in view of exerting a contamination prevention effect. In view of the above, in this embodiment, a plurality of pulses 104 constituting the pulse train 102 are applied intermittently.

An irradiation period T is set, for example, within a range from 0.5 to 50 s. A pulse cycle t1 is set, for example, within a range from 100 µs to 10 ms; the pulse width w1 is set, for example, within a range from 1 to 50 µs. A duty ratio may be set, for example, within a range from 0.001 to 0.1. Specifically, for example, T=5 (s), t1=1 (ms), and w1=10 (µs) are applicable. The duty ratio in this case is 0.01.

The experiments have proved that, in the case where a weak laser beam such as described above is intermittently applied to the specimen (having a thickness of 200 nm or less) in the form of a plurality of pulses, a contamination prevention effect on the specimen lasts for five to twenty-five minutes. In other words, a contamination prevention effect lasting for a long period of time sixty to three hundred times the laser beam irradiation period was confirmed. Hence, according to this embodiment, a period of time necessary for a process for contamination prevention can be remarkably reduced.

The experiments have also proved that, in the case where such a pulse train as is described above is applied to the contaminants already disposed on a specimen, the contaminants are removed from the specimen. From this fact, there can be noted a possibility that irradiation with a pulse train removes contaminants attached on the front surface of a specimen or contained in the specimen, so that the removed contaminants are discharged through vacuum suction. Note that irradiation with a pulse train can be replaced by irradiation with a weaker continuous wave.

FIG. 7 is a flowchart of an exemplary operation of the scanning transmission electron microscope illustrated in FIG. 1. The content of the exemplary operation corresponds to a specimen contamination prevention method. In step S10, the irradiation condition for an electron beam and that for a laser beam are set. In step S12, the position of an observation area on the specimen is defined relative to the optical axis. In step S14, a laser beam is applied as a pulse train to an irradiation area, which is a local area encompassing an observation area. A period of time for irradiation with the pulse train is very short, such as a few seconds. In step S16, an electron beam is applied to the specimen, the electron beam (or electrons) having penetrated the specimen is detected, and a secondary image is formed. The specimen is observed based on the image. An analysis result, such as a spectrum, may be displayed together with or instead of the image. In step S18, whether observation at other positions on the specimen is necessary, in particular, a determination is made as to whether application of a laser beam is necessary. In the case where observation is taking time and the specimen contamination prevention effect is accordingly being deteriorated, a laser beam may be applied to the same irradiation area again.

Figure 8:
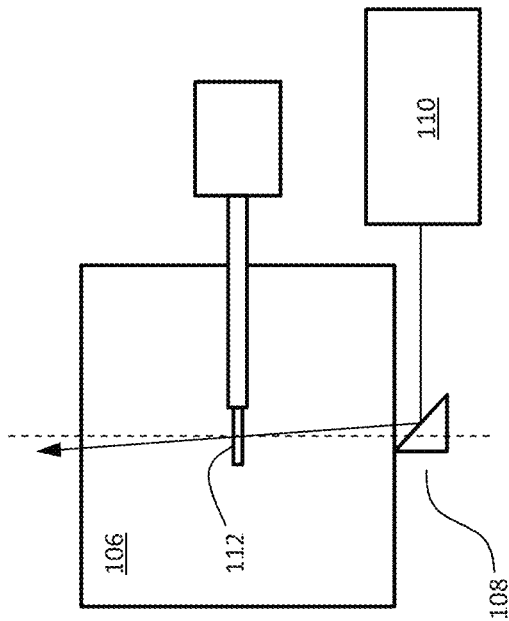
FIG. 8 illustrates a first modified example of the first embodiment.

FIG. 8 illustrates a first modified example of the first embodiment. As illustrated, a mirror unit 108 may be disposed below an objective lens 106 so that a laser beam is applied to a specimen 112 from the lower side of the specimen 112 along the optical axis. Reference number 110 indicates a generation unit. On the other hand, an electron beam is applied to the specimen 112 from the upper side of the specimen 112 along the optical axis.

Figure 9:
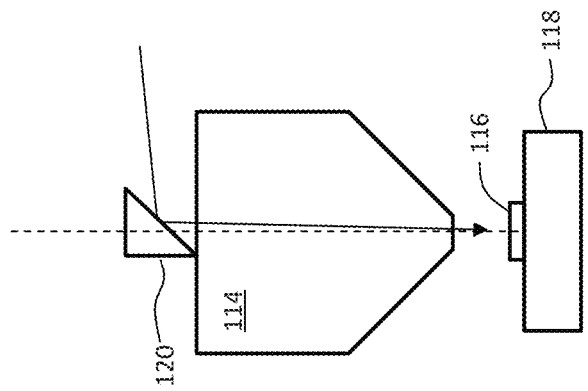
FIG. 9 illustrates a second modified example of the first embodiment.

FIG. 9 illustrates a second modified example of the first embodiment. The illustrated electron microscope is a scanning electron microscope, in which a stage is provided below an objective lens 114 for holding a specimen 116. Further, a mirror unit 120 is disposed on the upper side of the objective lens 114. A laser beam from a generation unit, not illustrated, is reflected on the mirror unit 120, and then applied to the specimen 116 along the optical axis.

Figure 10:
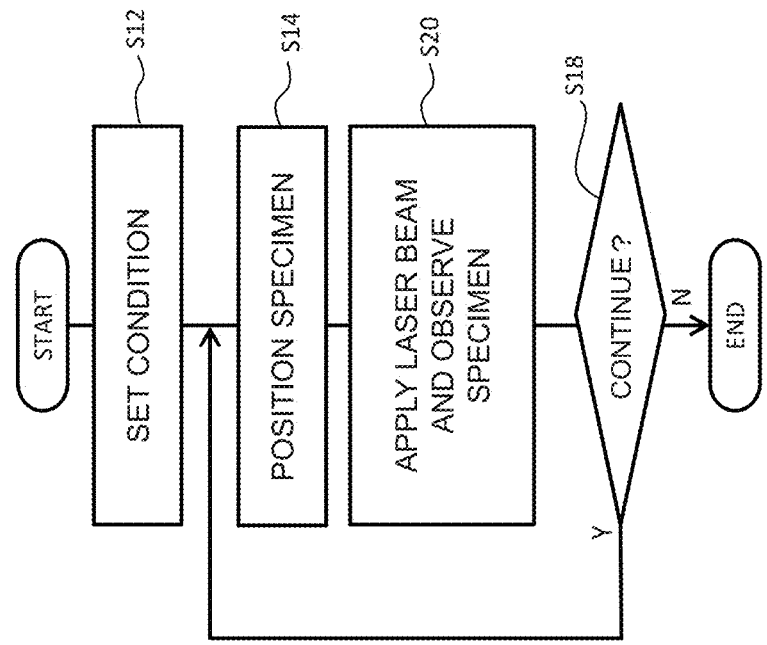
FIG. 10 illustrates a third modified example of the first embodiment.

FIG. 10 is a flowchart of an operation in a third modified example of the first embodiment. Steps in FIG. 10 corresponding to those in FIG. 7 are assigned the same step numbers. In step S12, respective irradiation conditions for an electron beam and for a laser beam are set. In step S14, a specimen is positioned. In step S20, the specimen is observed while a laser beam is applied to the specimen. In this case, a laser beam having such a weak strength that does not impede observation of the specimen and that can exert a specimen contamination prevention effect is employed. In step S20, an electron beam and a laser beam are applied in parallel at the same time. Alternatively, an electron beam and a laser beam may be applied alternately in a time sharing manner.

Figure 11:
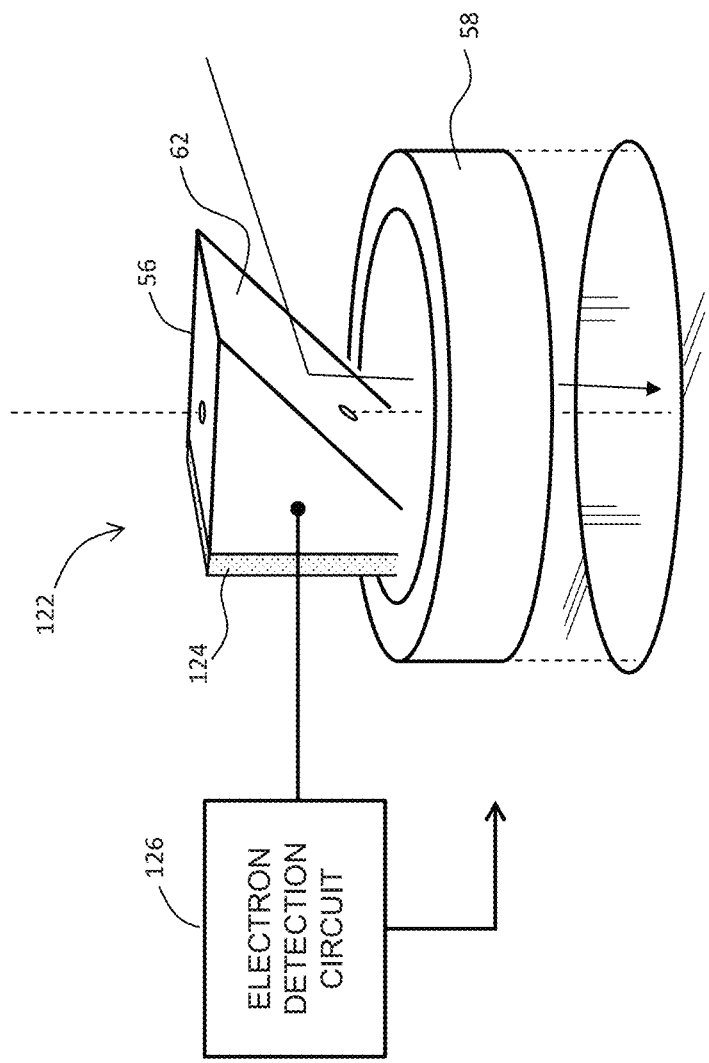
FIG. 11 illustrates a mirror unit according to a second embodiment.

FIG. 11 illustrates a major part of a second embodiment. A mirror unit 122 is removably mounted in the electron beam inlet of an objective lens. The mirror unit 122 includes the mirror base 58 and the mirror block 56. The mirror block 56 has the mirror surface 62. The mirror block 56 is mounted on the mirror base 58 via an electrically insulating member 124. That is, the mirror block 56 is in an electrically floating condition. In the mirror block 56, the entire surface of the mirror surface 62 other than a reflection portion may be subjected to insulating processing.

Electrons discharged from the specimen (secondary electrons, reflection electrons) move upward through the path in the objective lens to reach the mirror block 56. Then, a charge signal is outputted from the mirror block 56 to an electron detection circuit 126. The electron detection circuit 126 converts the charge signal into a detection signal.

In the case where the mirror block covers the path in the objective lens, it is difficult to dispose a detection device on the lower end surface of the condenser lens to detect electrons. According to the second embodiment, electrons can be detected by means of the mirror unit 122. The second embodiment has an advantage of reduction in the number of components.

FIG. 12 illustrates a modified example of the second embodiment. A mirror unit 130 includes an insulating ring 132, a disk 134, a mirror panel 140, and other components. The insulating ring 132 is made of electrically insulating member. The disk 134 and the mirror panel 140 are made of electrically conductive members, for example, aluminum. The insulating ring 132 is removably secured to the upper pole piece 48A of the pole piece.

The disk 134 and the mirror panel 140 are in an electrically floating condition. The mirror panel 140 is situated inclined, and has a mirror surface. A laser beam is reflected on the mirror surface. The disk 134 has an opening 136 formed therein and extending along the optical axis, and an electron beam passes through the opening 136. Meanwhile, a laser beam passes through an opening 138 formed in the disk 134.

Since the upper side of the path extending in the objective lens is covered with the disk 134 except for the two openings 136, 138, the electrons 142 having moved up from the below reach the disk 134. A charge signal is outputted from the disk 134 to the electron detection circuit 126. This modified example can enhance the electron catching efficiency. A voltage may be applied to the disk to facilitate catching the electrons.

In the structure illustrated in FIG. 1, a laser beam can be emitted to a specimen in a direction intersecting the optical axis (for example, in a diagonal direction). In this case, however, a problem may likely arise in that the laser beam being emitted to the specimen is blocked by other members (a specimen holder or the like) or that a laser beam cannot be readily applied to an appropriate area having an appropriate dimension at an appropriate position on a specimen. In contrast, emission of a laser beam along the optical axis does not cause such a problem. Further, in the structure illustrated in FIG. 1, a contamination prevention technique employing laser beam irradiation may be combined with other contamination prevention techniques. For example, a cold trap may be provided, or specimen cleaning with plasma or ozone may be employed.

The invention claimed is:

1. An electron microscope, comprising:
an electron beam emission unit configured to apply an electron beam to a specimen along an optical axis; and
a contamination prevention irradiation device configured to apply a laser beam for contamination prevention to the specimen along the optical axis, wherein
the specimen is a thin film specimen having a front surface and a rear surface;
the electron microscope further comprises a detection unit configured to detect an electron beam having penetrated the specimen, and
the laser beam applied to the specimen prevents deposition of contaminants on the front surface and the rear surface of the specimen.

2. The electron microscope according to claim 1, wherein
the contamination prevention irradiation device applies the laser beam to a contamination prevention irradiation area encompassing at least a part of the specimen, and
the contamination prevention irradiation area is a local area encompassing an observation area to be irradiated with the electron beam.

3. The electron microscope according to claim 2, wherein the contamination prevention irradiation device applies the laser beam to the contamination prevention irradiation area before the electron beam is applied to the observation area.

4. The electron microscope according to claim 3, wherein
the laser beam is composed of a pulse train that is regulated to prevent deposition of contaminants on the specimen, and
the contamination prevention irradiation device intermittently applies to the specimen a plurality of pulses constituting the pulse train.

5. The electron microscope according to claim 1, wherein
the contamination prevention irradiation device includes
a generation unit configured to generate the laser beam, and
a mirror unit having a mirror surface for reflecting the laser beam, the mirror unit being disposed between the generation unit and the specimen.

6. The electron microscope according to claim 5, further comprising a lens barrel for accommodating the electron beam emission unit, wherein
the generation unit is mounted outside the lens barrel, and the mirror unit is mounted inside the lens barrel.

7. The electron microscope according to claim 6, further comprising an objective lens having an electron beam inlet, an electron beam outlet, and a specimen space for accommodating the specimen, wherein
a laser beam is reflected on the mirror unit to be applied to the specimen in the objective lens through the electron beam inlet or the electron beam outlet.

8. An electron microscope, comprising:
an electron beam emission unit configured to apply an electron beam to a specimen along an optical axis;
a contamination prevention irradiation device configured to apply a laser beam for contamination prevention to the specimen along the optical axis, wherein the contamination prevention irradiation device includes
a generation unit configured to generate the laser beam, and
a mirror unit having a mirror surface for reflecting the laser beam, the mirror unit being disposed between the generation unit and the specimen;
a lens barrel for accommodating the electron beam emission unit; and
an objective lens having an electron beam inlet, an electron beam outlet, and a specimen space for accommodating the specimen,
wherein the generation unit is mounted outside the lens barrel, and the mirror unit is mounted inside the lens barrel,
wherein a laser beam is reflected on the mirror unit to be applied to the specimen in the objective lens through the electron beam inlet or the electron beam outlet, and
wherein the mirror unit is mounted on the objective lens.

9. The electron microscope according to claim 8, wherein
the electron beam inlet is defined on an end of the objective lens on one side,
the specimen space is defined in the objective lens at a position displaced toward the one side, and
the mirror unit is provided in or near the electron beam inlet of the objective lens.

10. An electron microscope, comprising:
an electron beam emission unit configured to apply an electron beam to a specimen along an optical axis; and
a contamination prevention irradiation device configured to apply a laser beam for contamination prevention to the specimen along the optical axis, wherein the contamination prevention irradiation device includes
a generation unit configured to generate the laser beam, and
a mirror unit having a mirror surface for reflecting the laser beam, the mirror unit being disposed between the generation unit and the specimen,
wherein a part or an entirety of the mirror unit functions as a sensor for receiving electrons discharged from the specimen.

11. A specimen contamination prevention method for an electron microscope according to claim 1, comprising:
generating the laser beam for contamination prevention; and
applying the laser beam for contamination prevention to a contamination prevention irradiation area that is a local area encompassing at least a part of the specimen, wherein
the laser beam for contamination prevention is applied to the specimen before the electron beam is applied to the specimen for observation of the specimen.

12. A specimen contamination prevention method for an electron microscope according to claim 9, comprising:
generating the laser beam for contamination prevention; and applying the laser beam for contamination prevention to a contamination prevention irradiation area that is a local area encompassing at least a part of the specimen, wherein the laser beam for contamination prevention is applied to the specimen before the electron beam is applied to the specimen for observation of the specimen.

13. A specimen contamination prevention method for an electron microscope according to claim 10, comprising:

generating the laser beam for contamination prevention; and applying the laser beam for contamination prevention to a contamination prevention irradiation area that is a local area encompassing at least a part of the specimen, wherein the laser beam for contamination prevention is applied to the specimen before the electron beam is applied to the specimen for observation of the specimen.

14. The electron microscope according to claim 10, further comprising a lens barrel for accommodating the electron beam emission unit, wherein the generation unit is mounted outside the lens barrel, and the mirror unit is mounted inside the lens barrel.

15. The electron microscope according to claim 14, further comprising an objective lens having an electron beam inlet, an electron beam outlet, and a specimen space for accommodating the specimen, wherein a laser beam is reflected on the mirror unit to be applied to the specimen in the objective lens through the electron beam inlet or the electron beam outlet.

\* \* \* \* \*